United States Patent
Li et al.

(10) Patent No.: US 12,125,873 B2
(45) Date of Patent: Oct. 22, 2024

(54) METHOD TO FORM A FIN STRUCTURE ON DEEP TRENCHES FOR A SEMICONDUCTOR DEVICE

(71) Applicant: HeFeChip Corporation Limited, Hong Kong (CN)

(72) Inventors: Liang Li, Guilderland, NY (US); Chunhui Low, Saratoga Springs, NY (US); Huang Liu, Mechanicville, NY (US)

(73) Assignee: HEFECHIP CORPORATION LIMITED, Sai Ying Pun (HK)

( * ) Notice: Subject to any disclaimer, the term of this patent is extended or adjusted under 35 U.S.C. 154(b) by 259 days.

(21) Appl. No.: 17/657,641

(22) Filed: Apr. 1, 2022

(65) Prior Publication Data
US 2023/0317771 A1    Oct. 5, 2023

(51) Int. Cl.
*H01L 21/84* (2006.01)
*H01L 21/8238* (2006.01)
*H01L 27/12* (2006.01)
*H01L 49/02* (2006.01)
*H10B 12/00* (2023.01)

(52) U.S. Cl.
CPC ...... *H01L 28/90* (2013.01); *H01L 21/823821* (2013.01); *H01L 21/845* (2013.01); *H01L 27/1203* (2013.01); *H10B 12/056* (2023.02); *H10B 12/30* (2023.02); *H10B 12/36* (2023.02); *H10B 12/37* (2023.02)

(58) Field of Classification Search
CPC ...... H10B 12/36; H10B 12/056; H10B 12/30; H10B 12/37; H10B 12/02; H01L 27/1203; H01L 21/823821; H01L 21/845
See application file for complete search history.

(56) References Cited

U.S. PATENT DOCUMENTS

| | | | |
|---|---|---|---|
| 6,620,699 B2 | 9/2003 | Scholz et al. | |
| 2005/0064635 A1 | 3/2005 | Ajmera et al. | |
| 2007/0048947 A1 | 3/2007 | Lee et al. | |
| 2017/0005098 A1* | 1/2017 | Aquilino | H01L 21/845 |

* cited by examiner

*Primary Examiner* — Thanhha S Pham
(74) *Attorney, Agent, or Firm* — Muncy, Geissler, Olds & Lowe, P.C.

(57) ABSTRACT

A method to form a fin structure on deep trenches (DTs) for a semiconductor device includes the following steps: A buried oxide layer (BOX) having the DTs, and silicon polies in the DTs is provided. A fin on the BOX and the silicon polies having poly fences is provided. A first mask is disposed on the fin. A liner is disposed on the BOX and the first mask, wherein the liner has a first part above the fin, a second part at lateral sides of the fin and a third part on the DTs and the BOX. A second mask is disposed on the first and the second parts of the liner. The second mask and the third parts of the liner are removed to reveal the first and the second parts of the liner. The poly fences are removed and spacers at the lateral sides are formed.

20 Claims, 17 Drawing Sheets

METHOD TO FORM A FIN STRUCTURE ON DEEP TRENCHES FOR A SEMICONDUCTOR DEVICE

TECHNICAL FIELD

Embodiments of the present disclosure are related to a method to form a semiconductor device, and more particularly, are related to a method to form a fin structure for a volatile memory.

BACKGROUND

Deep trench capacitors (DTCs) are vertical semiconductor devices that are used to provide capacitance to various integrated circuits. An advantage of using DTCs over package decapsulations is that they can be freely placed or embedded as close as possible to the desired circuit. In addition, DTCs can also provide higher capacitance per unit area.

Silicon-based integrated circuits, such as including a field effect transistor (FET) or a metal-oxide semiconductor FET (MOSFET), have consistently delivered greater speed, increased integration density and improved functionality. FinFET transistors, i.e., those in which the channel is formed in a raised "fin" of semiconductor material, are expected to support the scaling of a channel length to below 50 nm and perhaps to about 10 nm, thereby allowing additional improvements in integration density and functional speed.

When a deep trench capacitor is designed to be combined with a low-number-nanometer scale transistor, such as a fin FET (field effect transistor), it is very challenging to combine a current fin FET with the deep trench capacitor to boost performance when the SOI semiconductor process is scaled from 14 nm to 10 nm.

In addition, when the deep trench capacitor is designed to be combined with a transistor manufactured on a scale of below a dozen nm, such as a fin FET (field effect transistor), it is important that a good mechanism to prevent deep trench capacitors from being short therebetween, or to prevent deep trench poly from being short to sidewall of the deep trench, in order to satisfy the requirements of a design specification.

In other aspects, the logic circuit is often electrically combined with a memory to form a memory cell, so that the logic circuit can be controlled to store, write or delete data in the memory. The logic circuit may be a transistor and is arranged near by the memory. The development of trench-sidewall vertical device dynamic random access memory (DRAM) cells is revealed to have various problems. For example, trench-sidewall vertical device DRAM cells need space, therefore high-density cells have been difficult to achieve. Furthermore, trench-sidewall vertical device DRAM cells have been prone to bit-line shorts.

It is also crucial to get the fin-patterning mask to align with the fin above the deep trench due to an increasing transistor density and a decreasing transistor channel length. For a small space margin between the sidewall of the deep trench and the fin of the fin FET, an overlay control is very critical, and a little shift of the fin-patterning mask can cause unsymmetric space, resulting in poly residues while etching.

In addition, the current fin loop process employs complicated process steps including FH/HA/FQ to prevent DT to DT and DT to Poly short.

U.S. Patent Publication No. US2007/0048947 A1 discloses a multi-structured Si-fin and a method of manufacture thereof, but only discloses how to make a finFET with a spacer; however, the deep trench was not mentioned in this prior art, and was not applicable to eDRAM. U.S. Pat. No. 6,620,699 discloses a method for forming an inside nitride spacer for a deep trench device DRAM cell; however, there are issues, such as not solving the poly residue issue. U.S. Patent Publication No. 2005/0064635 A1 discloses a method for avoiding oxide undercut during pre-silicide clean for thin spacers FETs, but was not applicable to eDRAM.

Therefore, it is expected to have a fin structure and a method to form the fin structure, which can provide a mechanism to have a big and even opening space of the DT between the sidewall of the deep trench and the fin of fin FET, reduce the requirement of the overlayer control, prevent DT to DT or DT to poly from shorting, and spacers formed on the lateral sides of the fin to assist to remove the poly residue, and overcome the poly residue issues.

SUMMARY OF INVENTION

In view of the drawbacks in the above-mentioned prior art, the present invention proposes a method to form a fin structure on deep trenches (DTs) for a semiconductor device.

In accordance with one embodiment of the present disclosure, a method to form a fin structure on deep trenches (DTs) for a semiconductor device is provided, wherein the DTs includes a first DT, a second DT paired with the first DT, and a third DT adjacent to the second DT. The method comprises steps of: providing a buried oxide layer (BOX) having the DTs, and silicon polies in the DTs; providing a patterned fin on the BOX and the silicon polies, wherein the patterned fin extends over the first, the second, and the third DTs, and the silicon polies have poly fences adjacent to the patterned fin; disposing a first mask on the patterned fin; cutting a portion of the patterned fin between the second and the third DTs to form a cut fin; disposing a liner on the BOX and the first mask, wherein the liner has a first part above the cut fin, a second part at lateral sides of the cut fin, and a third part on the first and second DTs and the BOX; disposing a second mask on the first and the second parts of the liner; removing the second mask, the third parts of the liner to reveal the first part and the second part of the liner; and removing the poly fences and forming spacers at the lateral sides of the cut fin.

In accordance with another embodiment of the present disclosure, a method to form a fin structure on deep trenches (DTs) for a semiconductor device is provided, wherein the DTs includes a first DT, a second DT paired with the first DT, and a third DT adjacent to the second DT. The method comprises steps of: providing a buried oxide layer (BOX) having the DTs, and silicon polies in the DTs; providing a patterned fin on the BOX and the silicon polies, wherein the patterned fin extends over the first, the second and the third DTs, and the silicon polies have poly fences adjacent to the patterned fin; disposing a first mask on the patterned fin; cutting a portion of the patterned fin between the second and the third DTs to form a cut fin between the first and the second DTs; disposing a first liner on the BOX and the first mask; disposing a second liner on the first liner, wherein each of the first liner and the second liner has a first part above a top portion of the cut fin, a second part at lateral sides of the cut fin, and a third part above the first and the second DTs and the BOX; disposing a second mask on the first and the second parts of the second liner; removing the second mask, the third parts of the first and second liners to reveal the second part of the second liner; and removing the poly fences and forming spacers at the lateral sides of the cut fin.

In accordance with a further embodiment of the present disclosure, a method to form a fin structure on deep trenches (DTs) for a semiconductor device is provided. The method comprises steps of: providing a buried oxide layer (BOX) having the DTs, and silicon polies in the DTs; providing a fin on the BOX and the silicon polies, wherein the silicon polies have poly fences adjacent to the fin; disposing a first mask on the fin; disposing a liner on the BOX and the first mask, wherein the liner has a first part above the fin, a second part at lateral sides of the fin and a third part on the DTs and the BOX; disposing a second mask on the first and the second parts of the liner; removing the second mask, the third parts of the liner to reveal the first part and the second part of the liner; and removing the poly fences and forming spacers at the lateral sides of the fin.

The above embodiments and advantages of the present invention will become more readily apparent to those ordinarily skilled in the art after reviewing the following detailed descriptions and accompanying drawing.

DETAILED DESCRIPTION OF THE PREFERRED EMBODIMENTS

Please refer to all FIGS. of the present invention when reading the following detailed description, wherein all FIGS. of the present invention demonstrate different embodiments of the present invention by showing examples, and are to help the skilled person in the art to understand how to implement the present invention. The present examples provide sufficient embodiments to demonstrate the spirit of the present invention, each embodiment does not conflict with the others, and new embodiments can be implemented through an arbitrary combination thereof, i.e., the present invention is not restricted to the embodiments disclosed in the present specification.

Figure 1A:
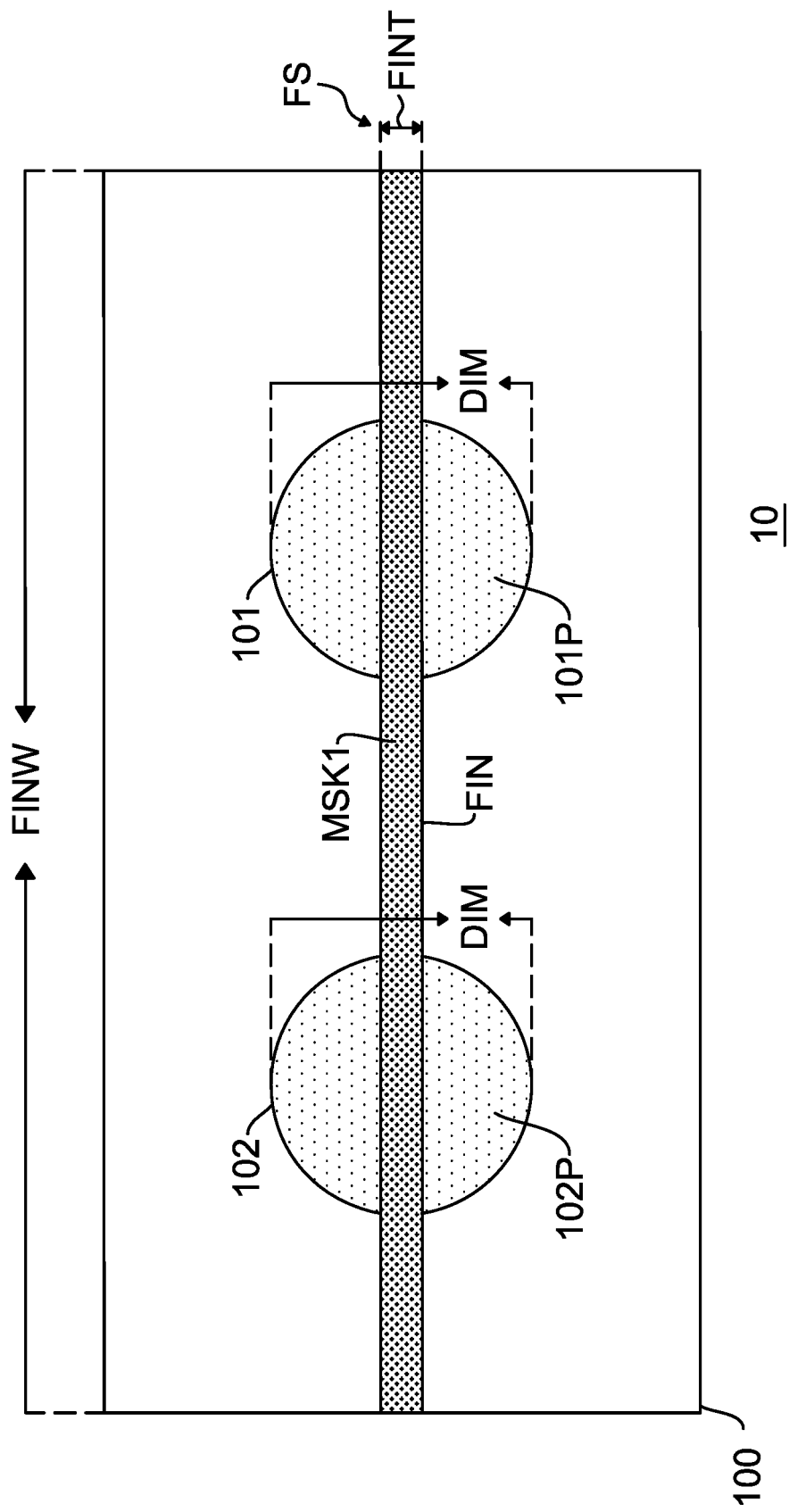
FIGS. 1A-1F are schematic diagrams showing a method to form a fin structure on deep trenches for a semiconductor device according to a preferred embodiment of the present disclosure.
Figure 1B:
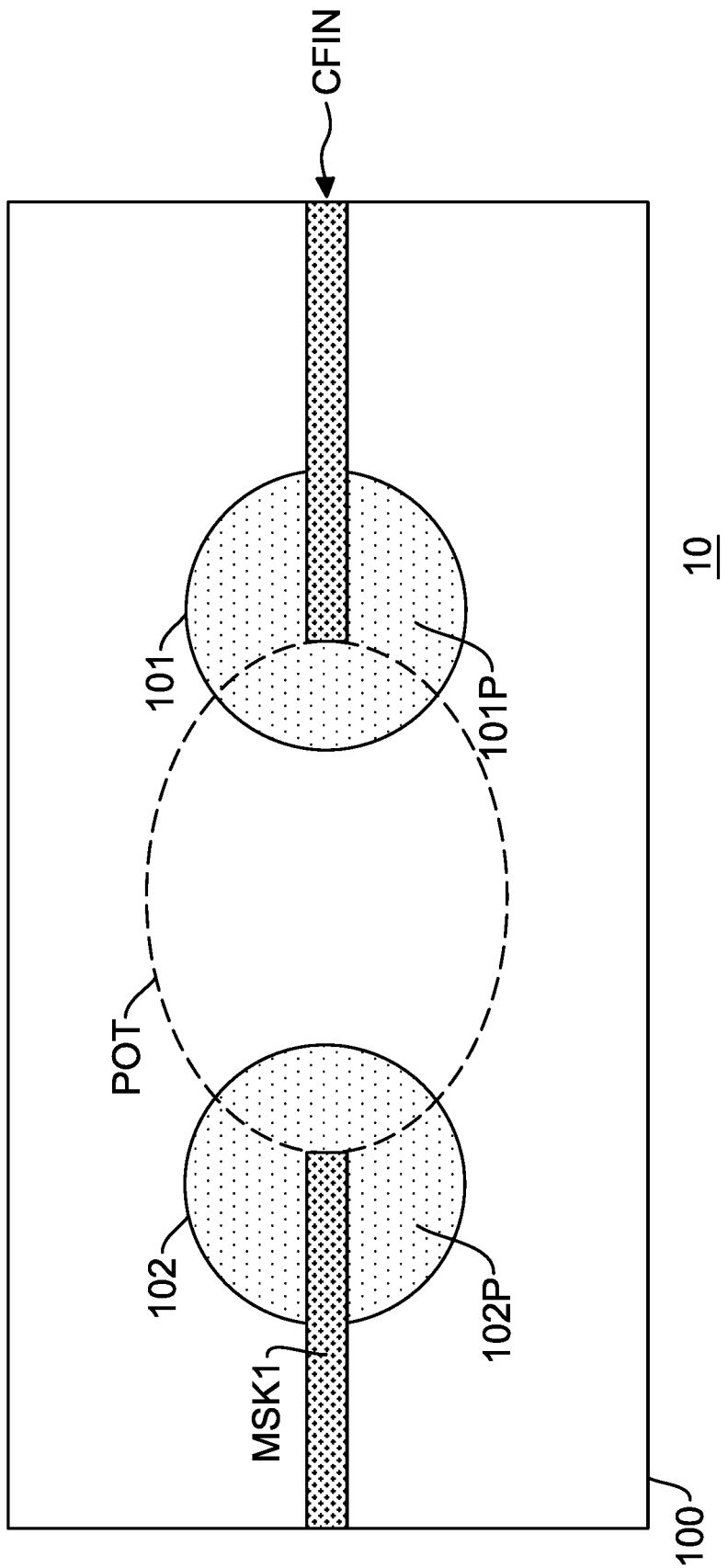
Figure 1C:
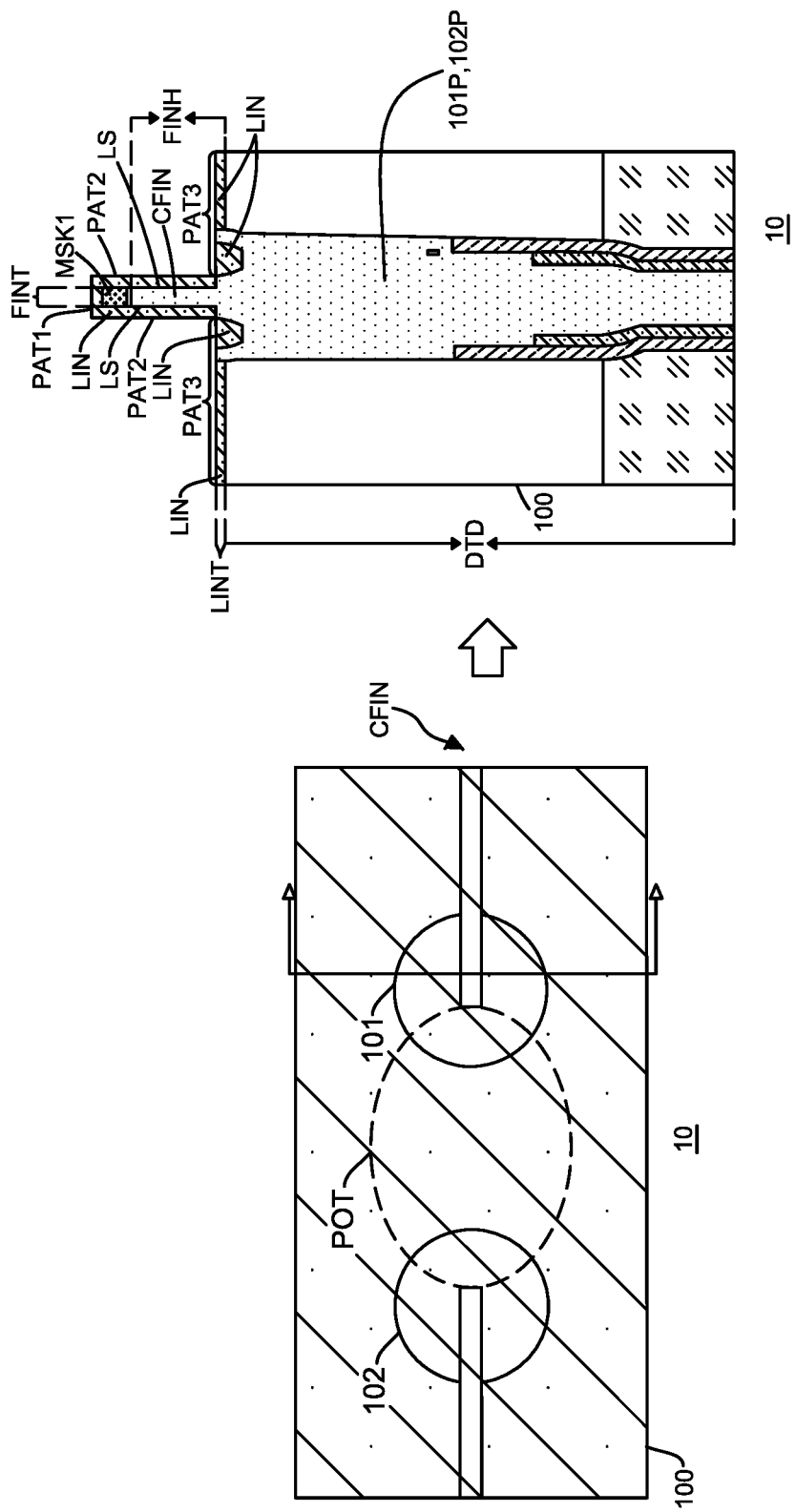
Figure 1D:
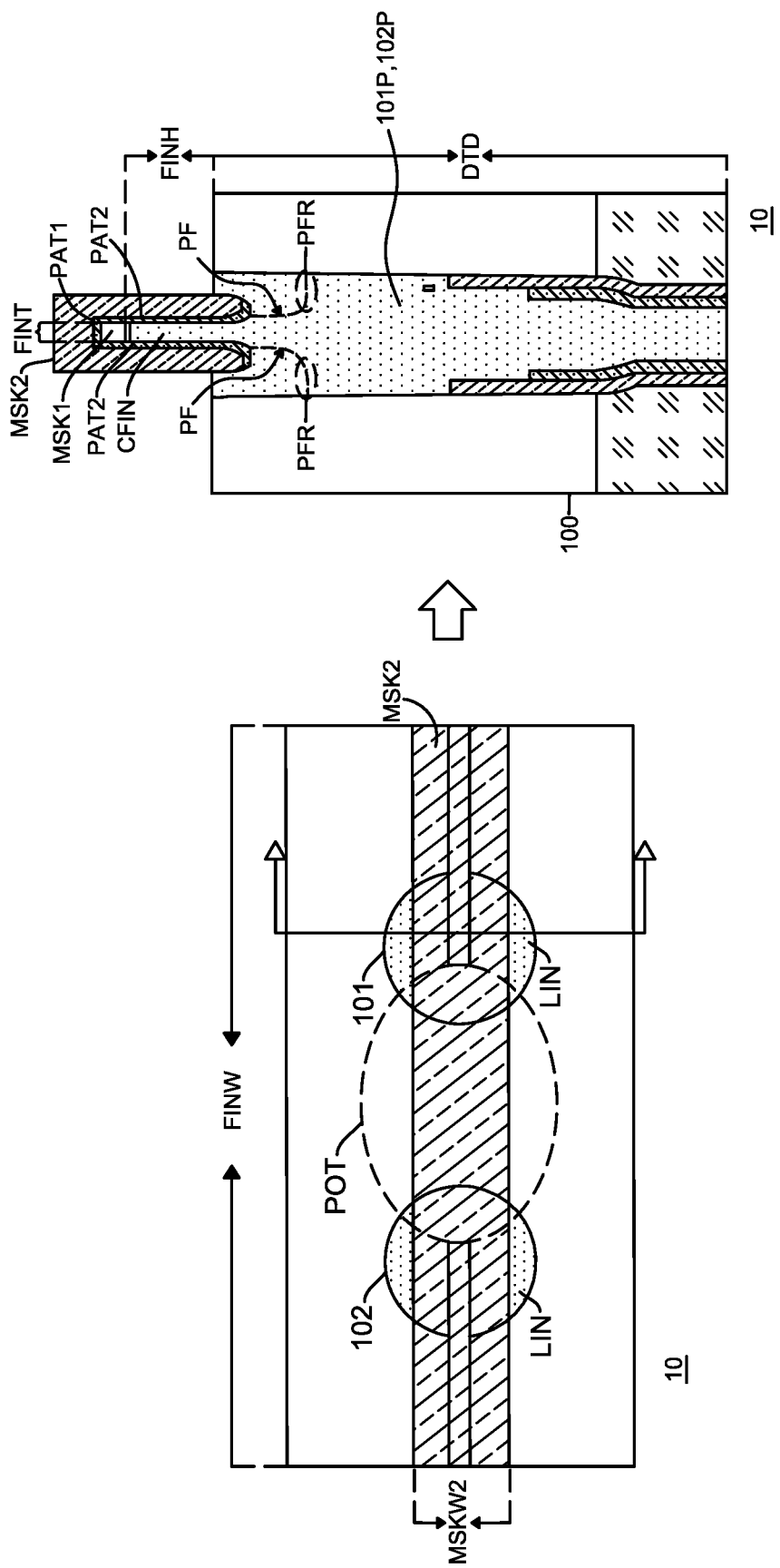
Figure 1E:
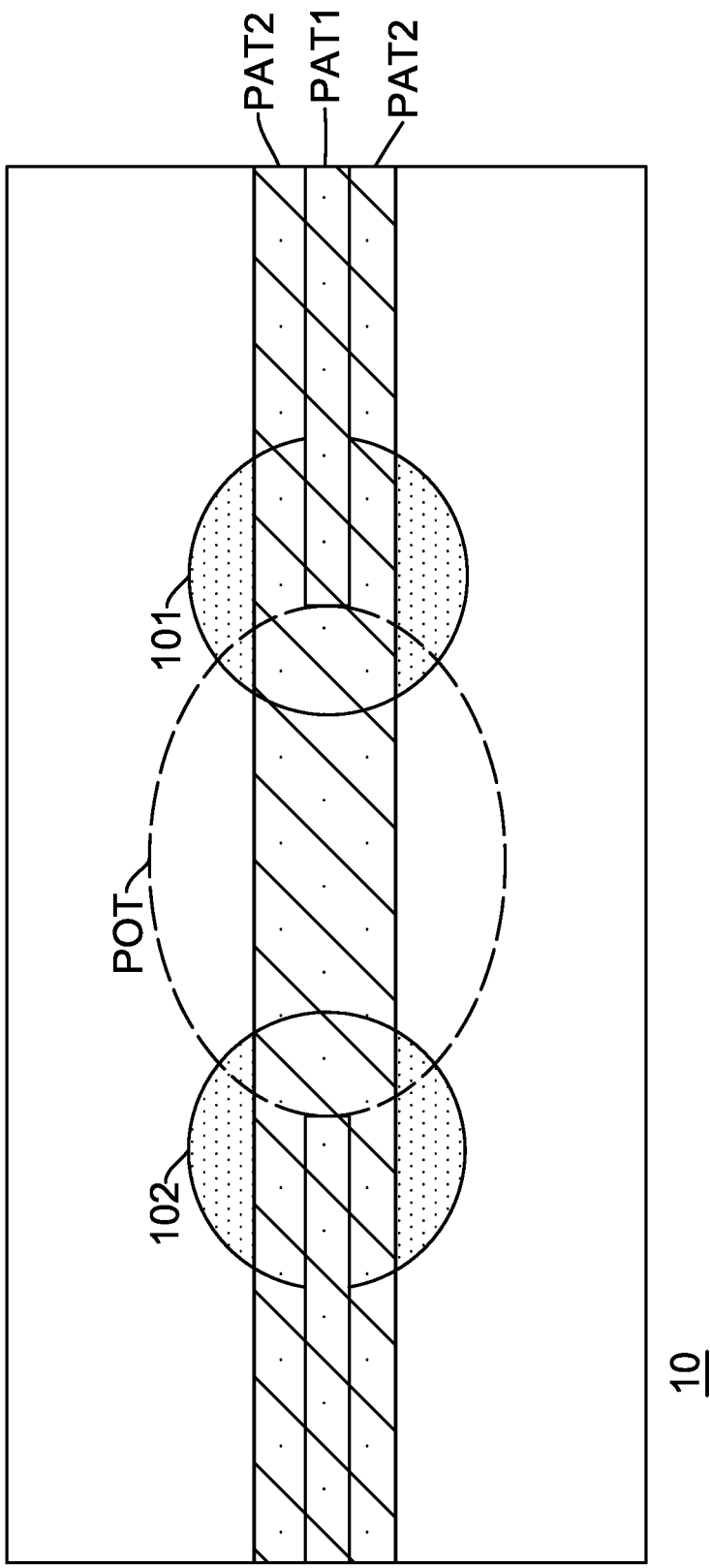
Figure 1F:
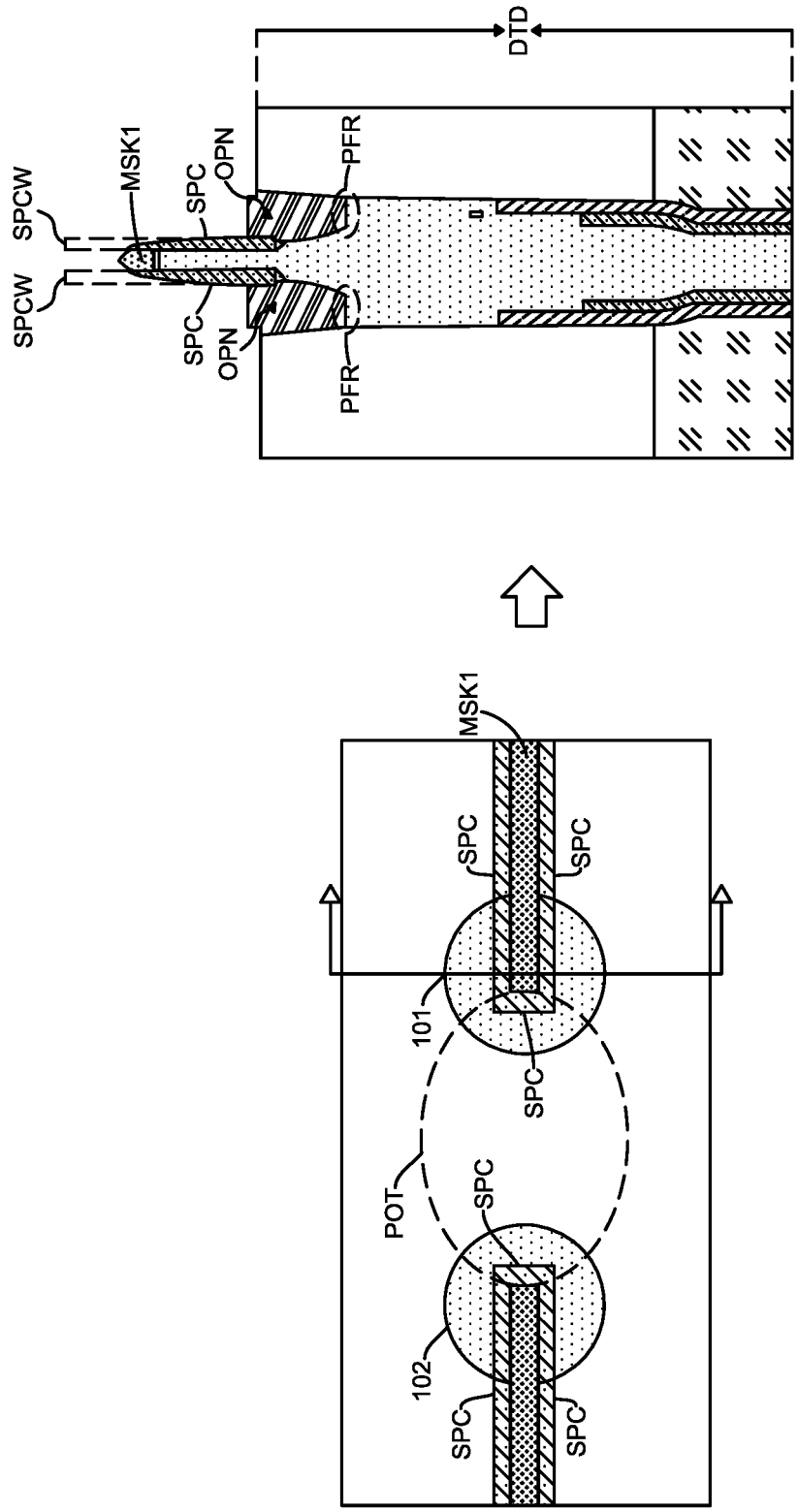

Please refer to FIGS. 1A-1F, which are schematic diagrams showing a method to form a fin structure FS on deep trenches (DTs) 101, 102 for a semiconductor device 10 according to a preferred embodiment of the present disclosure. Each of FIGS. 1C, 1D and 1F has a top view and a cross section view of the semiconductor device 10, wherein the DTs 101, 102 includes a first DT 101 and a second DT 102. Thus, these embodiments should not be construed as limited to the particular quantity of DTs illustrated herein but are to include quantity requirements in DTs that result, for example, from manufacturing. The method includes the following steps: As shown in FIG. 1A, a buried oxide layer (BOX) 100 having the DTs 101, 102, and silicon polies 101P, 102P in the DTs 101, 102 is provided. As shown in FIG. 1A, a patterned fin FIN on the BOX 100 and the silicon polies 101P, 102P is provided, wherein the patterned fin FIN extends over the first and the second DTs 101, 102, and the silicon polies 101P and 102P have poly fences PF adjacent to the patterned fin FIN as shown in FIG. 1D. As shown in FIG. 1A, a first mask MSK1 is disposed on the patterned fin FIN. As shown in FIG. 1B, a portion POT of the patterned fin FIN between the second and the first DTs 102, 101 is cut to form a cut fin CFIN. As shown in FIG. 1C, a liner LIN is disposed on the BOX 100 and the first mask MSK1, wherein the liner LIN has a first part PAT1 above the cut fin CFIN, a second part PAT2 at lateral sides LS of the cut fin CFIN, and a third part PAT3 on the first and second DTs 101, 102 and the BOX 100. As shown in FIG. 1D, a second mask MSK2 is disposed on the first and the second parts PAT1, PAT2 of the liner LIN. As shown in FIG. 1E, the second mask MSK2 and the third part PAT of the liner LIN are removed to reveal the first part PAT1 and the second part PAT2 of the liner LIN. In addition, as shown in FIG. 1F, the poly fences PF are removed and spacers SPC at the lateral sides LS of the cut fin CFIN are formed.

In any one of the embodiments of the present disclosure, the first mask MSK1 includes a SiN hard mask; and the method further includes a step of removing the third part PAT3 of the liner LIN by performing a wet etching process.

Please refer to FIG. 1D. In any one of the embodiments of the present disclosure, the second mask MSK2 includes an FH mask configured to protect the cut fin CFIN, and has a width MSKW2 ranging from 50 to 80 nm; and the second mask MSK2 is configured for removing the poly fences PF.

In any one of the embodiments of the present disclosure, the method further includes the steps: The second mask MSK2 is aligned with the cut fin CFIIN by performing an overlay control process, wherein there are openings OPN between the lateral sides LS and the DTs 101, 102 of the cut fin CFIN, such as the openings OPN shown in FIG. 1F. In addition, the openings OPN is expanded so that the openings OPN are big enough for removing fence residues PFR in the DTs 101, 102 of the cut fin CFIN, for example, from FIGS. 1D-1F.

Please refer to FIG. 1C. In any one of the embodiments of the present disclosure, the liner LIN includes an oxide liner having a thickness LINT in a range of 2 to 4 nm; and the openings OPN are tunable and scalable by the thickness of the oxide liner.

In any one of the embodiments of the present disclosure, the step of removing the poly fences PF is performed by a reactive ion etching (RIE) process, such as an uneven directional etching process.

Please refer to FIG. 1A. In any one of the embodiments of the present disclosure, each of the DTs 101, 102 has a diameter DIM ranging from 50 nm to 100 nm, and has a depth DTD ranging from 2 to 5 um.

Please refer to FIG. 1C. In any one of the embodiments of the present disclosure, the cut fin CFIN has a thickness FINT ranging from 10 to 20 nm, has a height FINH ranging from 30 to 50 nm, and has a width FINW ranging from 150 to 400 nm.

Please refer to FIG. 1F. In any one of the embodiments of the present disclosure, each of the spacers SPC has a width SPCW ranging from 10 to 30 nm; and through provision of the spacers SPC, the poly fences PF are effectively removed.

In any one of the embodiments of the present disclosure, cutting the fin FIN can be performed before or after the spacers SPC are formed.

In any one of the embodiments of the present disclosure, the method further includes a step of: removing the first part PAT1 of the liner LIN by a wet etching.

Figure 2A:
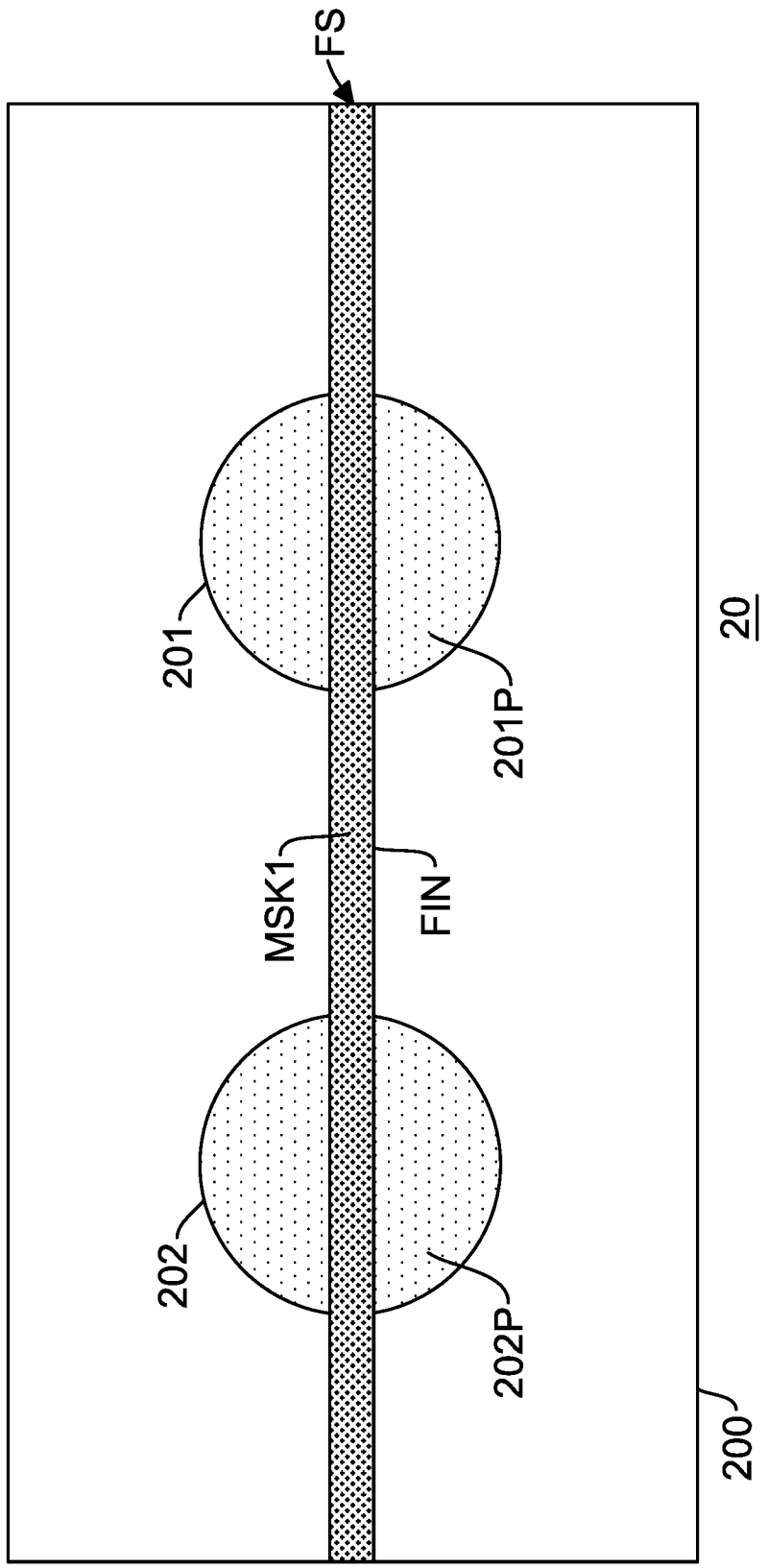
FIGS. 2A-2E are schematic diagrams showing a method to form a fin structure on deep trenches for a semiconductor device according to another preferred embodiment of the present disclosure.
Figure 2B:
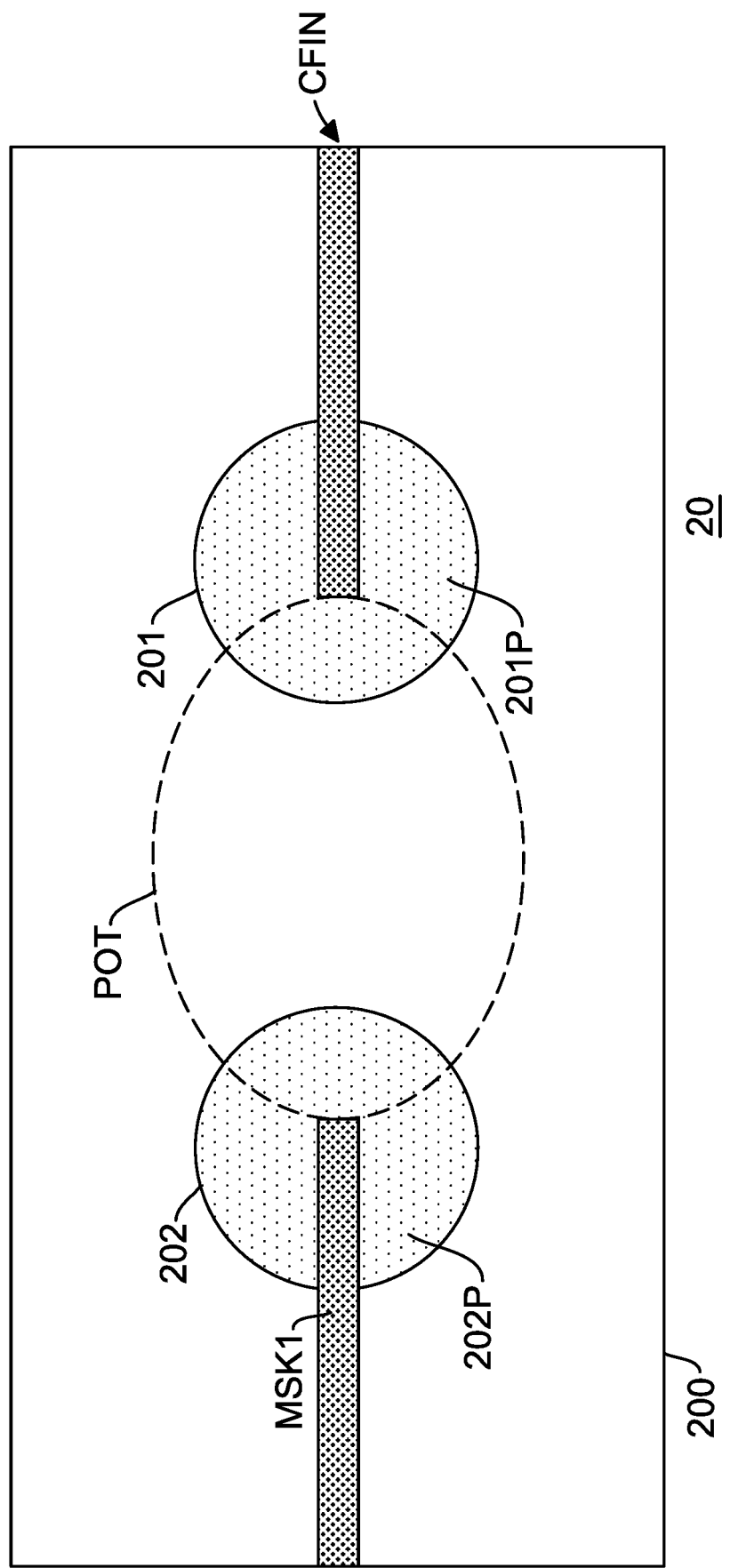
Figure 2C:
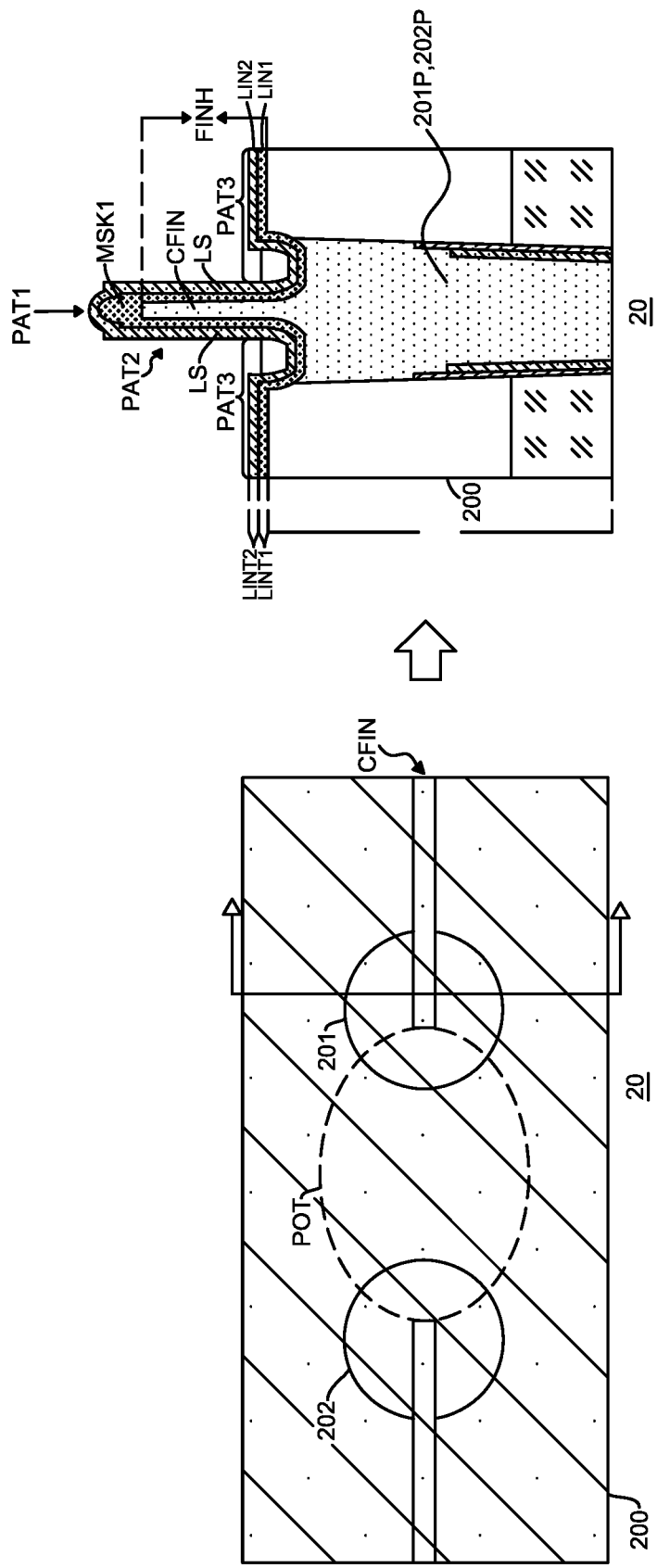
Figure 2D:
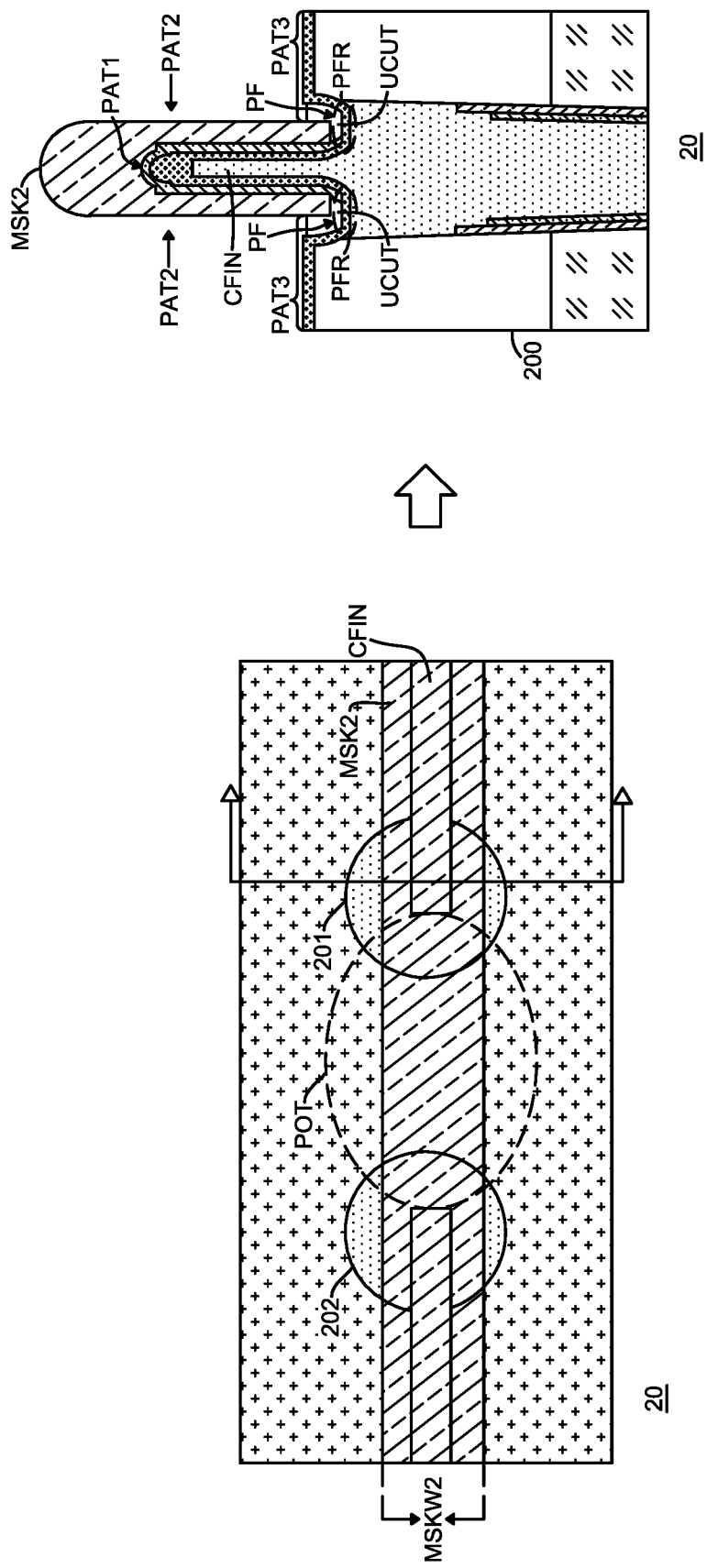
Figure 2E:
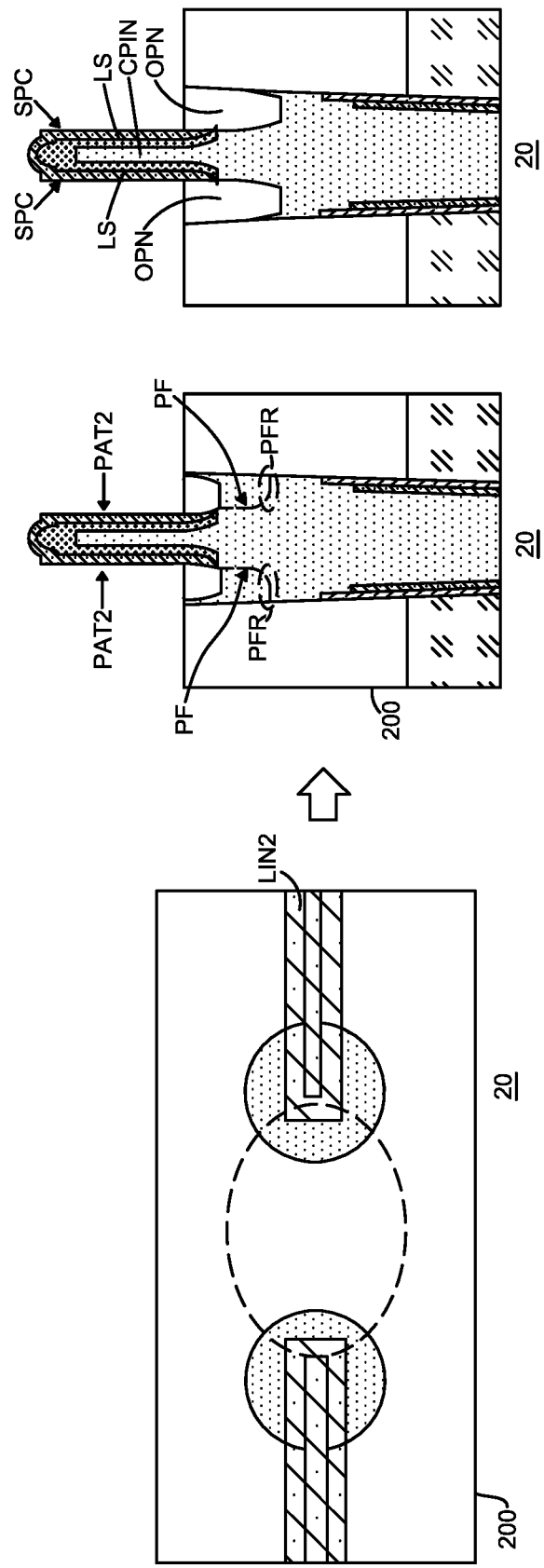

Please refer to FIGS. 2A-2E, which are schematic diagrams showing a method to form a fin structure FS on deep trenches (DTs) 201, 202 for a semiconductor device 20 according to another preferred embodiment of the present disclosure. Each of FIGS. 2C, 2D, 2E has a top view and a cross section view of the semiconductor device 20, wherein the DTs 201, 202 includes a first DT 201 and a second DT 20. Thus, these embodiments should not be construed as limited to the particular quantity of DTs illustrated herein but are to include quantity requirements in DTs that result, for example, from manufacturing. The method includes the steps of: As shown in FIG. 2A, a buried oxide layer (BOX) 200 having the DTs 201, 202, and silicon polies 201P, 202P in the DTs 201, 202 is provided. As shown in FIG. 2A, a patterned fin FIN on the BOX 200 and the silicon polies 201P, 202P is provided, wherein the patterned fin FIN extends over the first, the second and the third DTs 201, 202, and the silicon polies 201P, 202P have poly fences PF adjacent to the patterned fin FIN as shown in FIG. 2D. As shown in FIG. 2A, a first mask MSK1 is disposed on the patterned fin FIN. As shown in FIG. 2B, a portion POT of the patterned fin FIN between second and the first DTs 202, 201 is cut to form a cut fin CFIN between the first and the second DTs 201, 202; in FIG. 2C, a first liner LIN1 is disposed on the BOX 200 and the first mask MSK1. As shown in FIG. 2C, a second liner LIN2 is disposed on the first liner LIN1, wherein each of the first liner LIN1 and the second liner LIN2 has a first part PAT1 above a top portion of the cut fin CFIN, a second part PAT2 at lateral sides LS of the cut fin CFIN, and a third part PAT3 above the first and the second DTs 201, 202 and the BOX 200. As shown in FIG. 2D, a second mask MSK2 is disposed on the first and the second parts PAT1, PAT2 of the second liner LIN2. As shown in FIG. 2E, the second mask MSK2 and the third parts PAT3 of the first and second liners LIN1, LIN2 are removed to reveal the second part PAT2 of the second liner LIN2. In addition, as shown in FIG. 2E, the poly fences PF are removed and spacers SPC at the lateral sides LS of the cut fin CFIN are formed.

In any one of the embodiments of the present disclosure, the step of removing the third part PAT3 of the second liner LIN2 is performed by a wet etching process with undercut UCUT around the second part PAT2 of the second liner LIN2 in the DTs 201, 202 or by a reactive ion etching (RIE) as shown in FIG. 2D; and the step of removing the poly fences PF is performed by the RIE.

Please refer to FIG. 2C. In any one of the embodiments of the present disclosure, the first liner LIN1 includes a SiN liner having a thickness LINT1 ranging from 2 to 4 nm; the second liner LIN2 includes an oxide liner having a thickness LINT2 ranging from 2 to 4 nm; and the first mask MSK1 includes a SiN hard mask.

Please refer to FIG. 2D. In any one of the embodiments of the present disclosure, the second mask MSK2 includes an FH mask configured to protect the cut fin CFIN, and has a width MSKW2 ranging from 50 to 80 nm; and the second mask MSK2 is configured for removing the poly fences PF.

Please refer to FIG. 2D. In any one of the embodiments of the present disclosure, the method further comprises the following steps: The second mask MSK2 is controlled to align with the cut fin CFIN by performing an overlay control process, wherein there are openings OPN between the lateral sides and the DTs as shown in FIG. 2E; and in addition, the openings OPN is expanded so that the openings OPN are big enough for removing fence residues PFR in the DTs 201, 202.

Please refer to FIGS. 2C and 2E. In any one of the embodiments of the present disclosure, the openings OPN are tunable and scalable by the thickness LINT2 of the second liner LIN2, and the step of removing the poly fences PF is performed by a reactive ion etching (RIE) process.

Please refer to FIG. 2E. In any one of the embodiments of the present disclosure, the poly fences PF are effectively removed through provision of the spacers SPC.

Figure 3A:
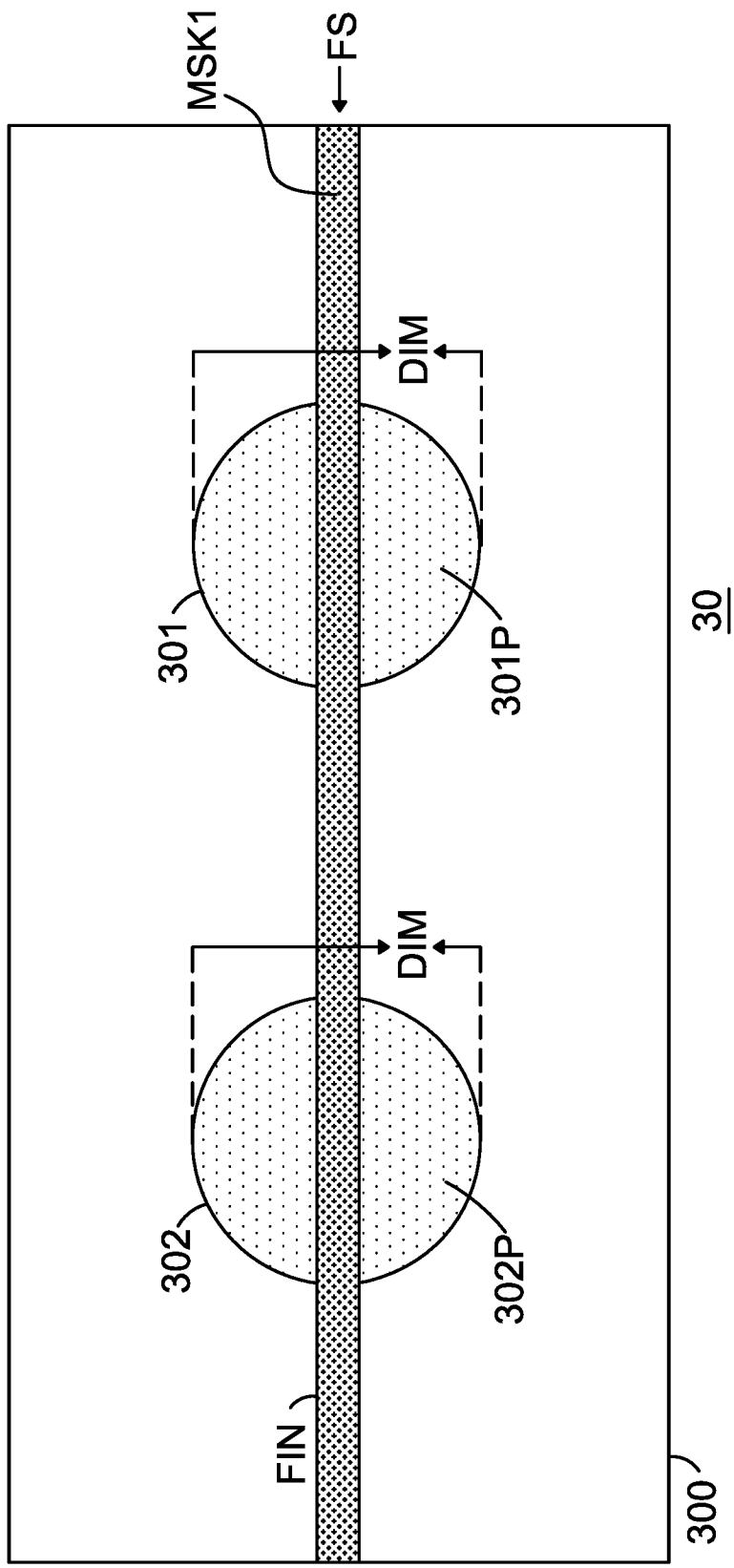
FIGS. 3A-3F are schematic diagrams showing a method to form a fin structure on deep trenches for a semiconductor device according to another preferred embodiment of the present disclosure.
Figure 3B:
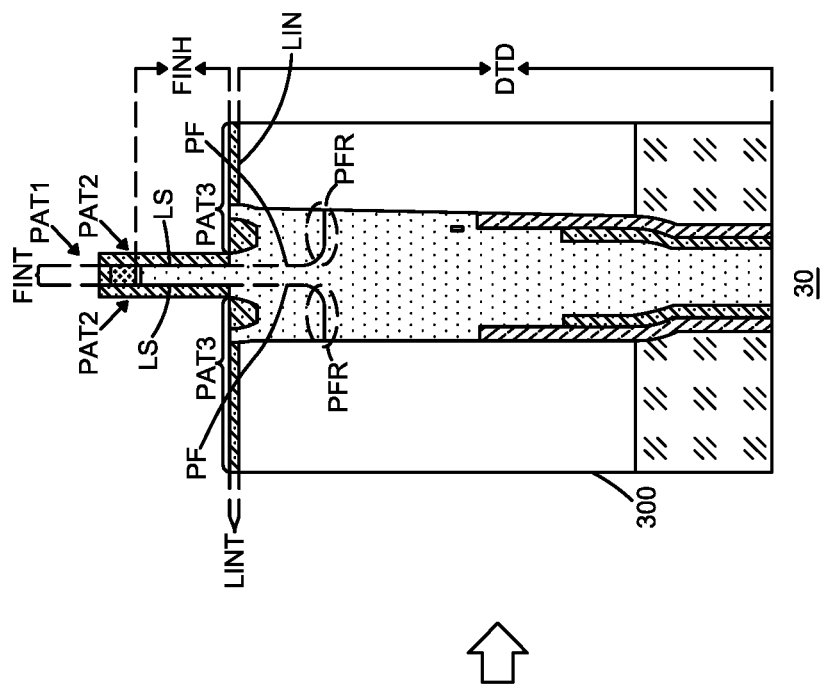
Figure 3B:
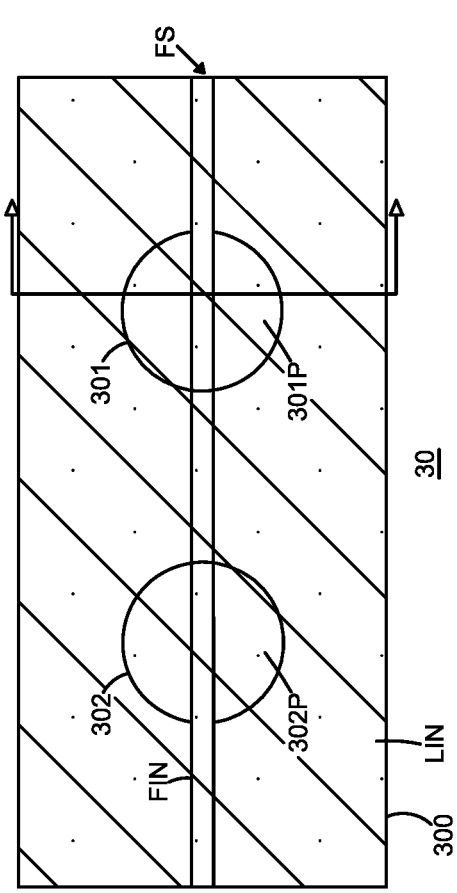
Figure 3C:
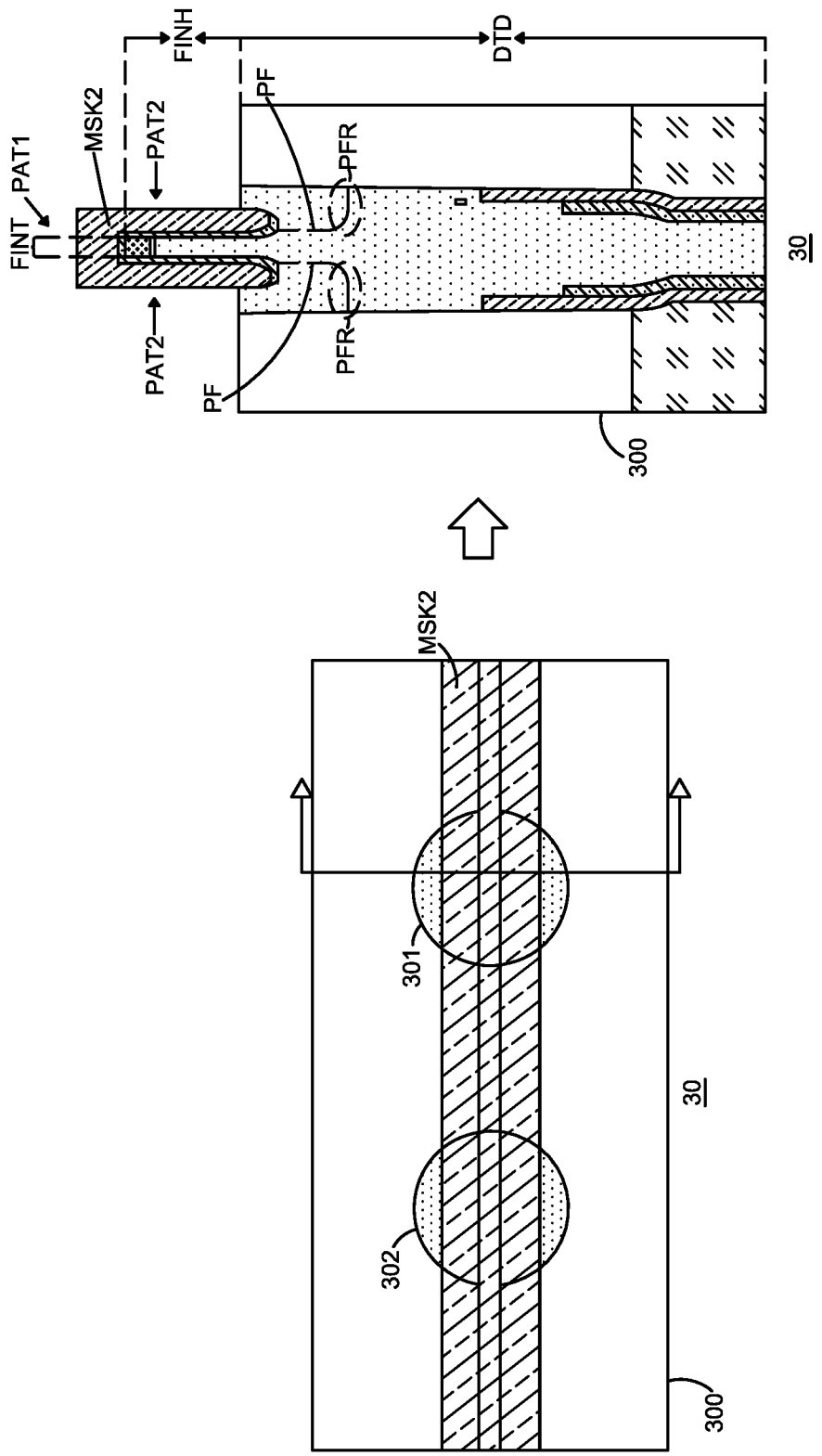
Figure 3D:
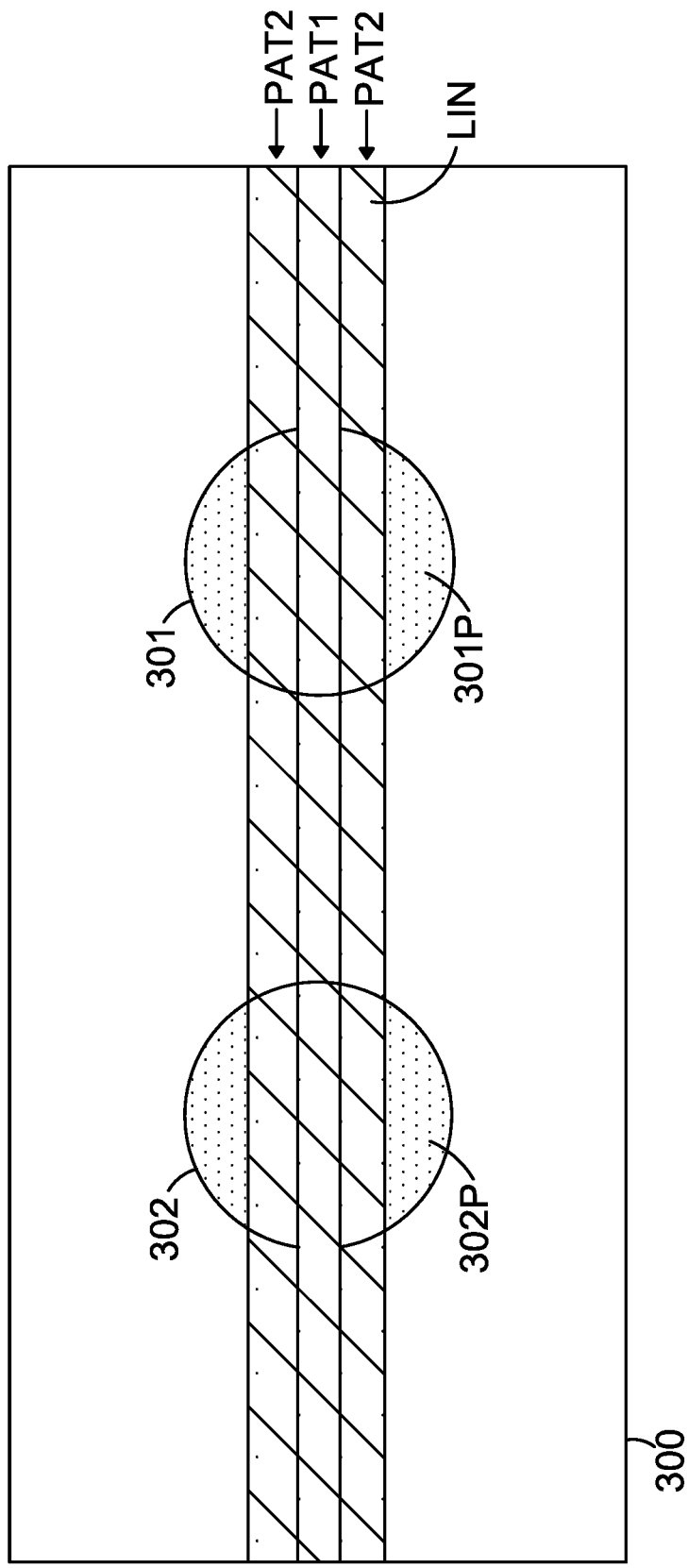
Figure 3E:
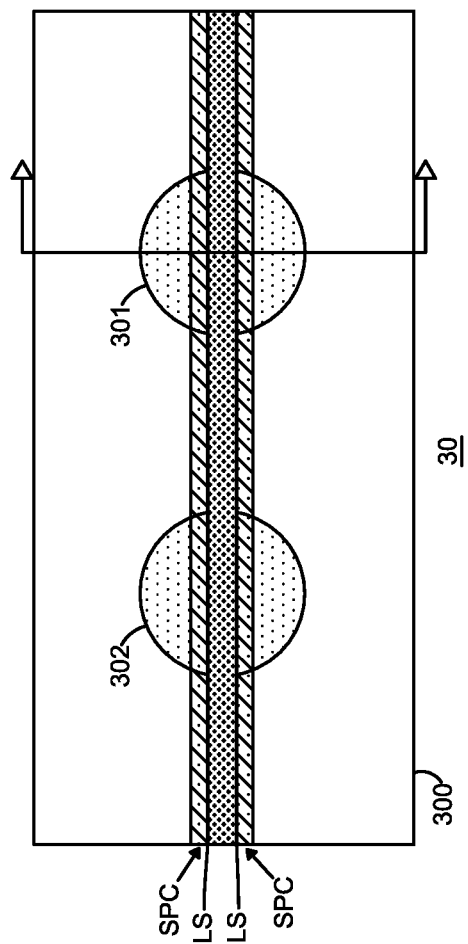

Please refer to FIGS. 3A-3F, which are schematic diagrams showing a method to form a fin structure FS on deep trenches (DTs) 301, 302 for a semiconductor device 30 according to another preferred embodiment of the present disclosure. Thus, these embodiments should not be construed as limited to the particular quantity of DTs illustrated herein but are to include quantity requirements in DTs that result, for example, from manufacturing. Each of FIGS. 3B, 3C, 3E has a top view and a cross section view of the semiconductor device 30. The method includes the following steps: As shown in FIG. 3A, a buried oxide layer (BOX) 300 having the DTs 301, 302, and silicon polies 301P, 302P in the DTs 301, 302 is provided. As shown in FIG. 3A, a fin FIN on the BOX 300 and the silicon polies 301P, 302P is provided, wherein the silicon polies 301P, 302P have poly fences PF adjacent to the fin FIN as shown in FIGS. 3B-3C; As shown in FIG. 3A, a first mask MAK1 is disposed on the fin FIN. As shown in FIG. 3B, a liner LIN is disposed on the BOX 300 and the first mask MSK1, wherein the liner LIN has a first part PAT1 above the fin FIN, a second part PAT2 at lateral sides LS of the fin FIN and a third part PAT3 on the DTs 301, 302 and the BOX 300. As shown in FIG. 3C, a second mask MSK2 is disposed on the first and the second parts PAT1, PAT2 of the liner LIN. As shown in FIG. 3D, the second mask MSK2 and the third parts PAT3 of the liner LIN are removed to reveal the first part PAT1 and the second part PAT2 of the liner LIN. In addition, as shown in FIG. 3E, the poly fences PF are removed and spacers SPC at the lateral sides LS of the fin FIN are formed.

In any one of the embodiments of the present disclosure, the method further includes the following steps: The second mask MSK2 is aligned with the fin FIIN by performing an overlay control process, wherein there are openings OPN between the lateral sides LS and the DTs 301, 302 of the fin FIN, such as the openings OPN shown in FIG. 3E. In addition, the openings OPN is expanded so that the openings OPN are big enough for removing fence residues PFR in the DTs 301, 302 of the fin FIN, for example, from FIGS. 3B-3E.

In any one of the embodiments of the present disclosure, the method further includes a step of: removing the third part PAT3 of the liner LIN through a wet etching process.

Figure 3F:
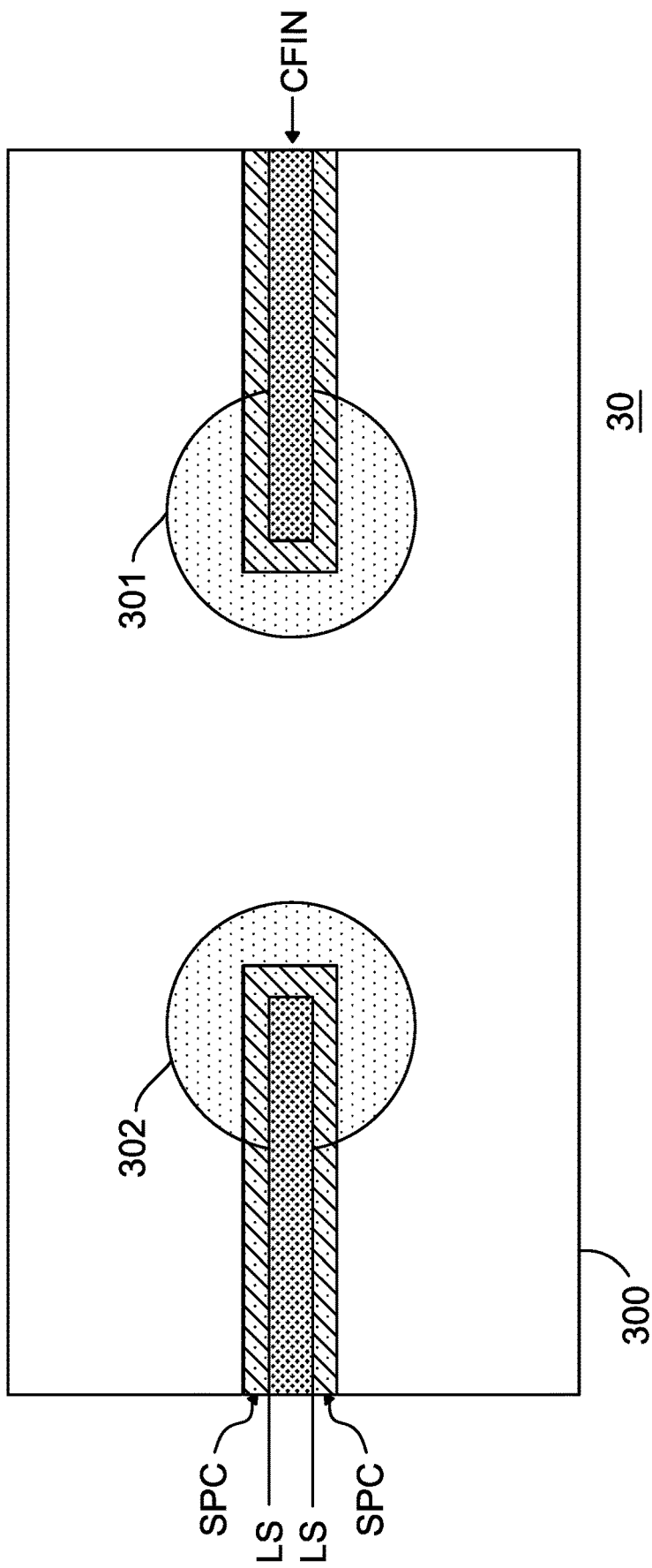

Please refer to FIG. 3F. In any one of the embodiments of the present disclosure, the method further includes the following steps: The poly fences PF is removed by a reactive ion etching (RIE) process. In addition, the fin FIN between DTs 301, 302 is cut to form a cut fin CFIN.

Please refer to FIG. 3C. In any one of the embodiments of the present disclosure, the second mask MSK2 includes an FH mask configured to protect the fin FIN, and has a width FINW ranging from 50 to 80 nm as shown in FIG. 3C; and the second mask MSK2 is configured for removing the poly fences PF.

Please refer to FIGS. 3B and 3E. In any one of the embodiments of the present disclosure, the liner LIN includes an oxide liner having a thickness LINT in a range of 2 to 4 nm; and the openings OPN are tunable and scalable by the thickness LINT of the oxide liner.

Please refer to FIGS. 3A-3B. In any one of the embodiments of the present disclosure, each of the DTs 301, 302 has a diameter DIM ranging from 50 nm to 100 nm, and has a depth DTD ranging from 2 to 5 um.

Please refer to FIGS. 3B-3C. In any one of the embodiments of the present disclosure, the fin FIN has a thickness FINT ranging from 10 to 20 nm, has a height FINH ranging from 30 to 50 nm, and has a width ranging from 200 to 300 nm.

Please refer to FIG. 3E. In any one of the embodiments of the present disclosure, each of the spacers SPC has a width SPCW ranging from 10 to 30 nm; and through provision of the spacers SPC, the poly fences PF are effectively removed.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

The invention claimed is:

1. A method to form a fin structure on deep trenches (DTs) for a semiconductor device, wherein the DTs comprise a first DT and a second DT, and the method comprises steps of:
providing a buried oxide layer (BOX) having the DTs, and silicon polies in the DTs;
providing a patterned fin on the BOX and the silicon polies, wherein the patterned fin extends over the first DT and the second DT, and the silicon polies have poly fences adjacent to the patterned fin;
disposing a first mask on the patterned fin;
cutting a portion of the patterned fin between the second DT and the first DT to form a cut fin;
disposing a liner on the BOX and the first mask, wherein the liner has a first part above the cut fin, a second part at lateral sides of the cut fin, and a third part on the first DT, the second DT and the BOX;
disposing a second mask on the first part of the liner and the second part of the liner;
removing the second mask, the third part of the liner to reveal the first part of the liner and the second part of the liner; and
removing the poly fences and forming spacers at the lateral sides of the cut fin.

2. The method as claimed in claim 1, wherein the first mask comprises a SiN hard mask, and the method further comprises:
removing the third part of the liner by performing a wet etching process.

3. The method as claimed in claim 1, wherein:
the second mask comprises an FH mask configured to protect the cut fin, and has a width ranging from 50 to 80 nm; and
the second mask is configured for removing the poly fences.

4. The method as claimed in claim 1, further comprising steps of:
aligning the second mask with the cut fin by performing an overlay control process, wherein there are openings between the lateral sides and the DTs; and
expanding the openings so that the openings are big enough for removing fence residues in the DTs.

5. The method as claimed in claim 4, wherein:
the liner comprises an oxide liner having a thickness in a range of 2 to 4 nm; and
the openings are tunable and scalable by the thickness of the oxide liner.

6. The method as claimed in claim 5, wherein the step of removing the poly fences is performed by a reactive ion etching (RIE) process.

7. The method as claimed in claim 1, wherein each of the DTs has a diameter ranging from 50 nm to 100 nm, and has a depth ranging from 2 to 5 um.

8. The method as claimed in claim 1, wherein in a cross-section direction of the semiconductor device, the cut fin has a thickness ranging from 10 to 20 nm, has a height ranging from 30 to 50 nm, and has a width ranging from 150 to 400 nm.

9. The method as claimed in claim 1, wherein:
each of the spacers has a width ranging from 10 to 30 nm; and
through provision of the spacers, the poly fences are effectively removed.

10. A method to form a fin structure on deep trenches (DTs) for a semiconductor device, wherein the DTs comprise a first DT and a second DT, and the method comprises steps of:
providing a buried oxide layer (BOX) having the DTs, and silicon polies in the DTs;
providing a patterned fin on the BOX and the silicon polies, wherein the patterned fin extends over the first DT and the second DT, and the silicon polies have poly fences adjacent to the patterned fin;
disposing a first mask on the patterned fin;
cutting a portion of the patterned fin between the second DT and the first DT to form a cut fin;
disposing a first liner on the BOX and the first mask;
disposing a second liner on the first liner, wherein each of the first liner and the second liner has a first part above a top portion of the cut fin, a second part at lateral sides of the cut fin, and a third part above the first DT, the second DT and the BOX;
disposing a second mask on the first part of the second liner and the second part of the second liner;
removing the second mask, the third part of the first liner and the second liner to reveal the second part of the second liner; and
removing the poly fences and forming spacers at the lateral sides of the cut fin.

11. The method as claimed in claim 10, wherein:
the step of removing the third part of the second liner is performed by a wet etching process with undercut around the second part of the second liner in the DTs or by a reactive ion etching (RIE); and
the step of removing the poly fences is performed by the RIE.

12. The method as claimed in claim 10, wherein:
the first liner comprises a SiN liner having a thickness ranging from 2 to 4 nm;
the second liner comprises an oxide liner having a thickness ranging from 2 to 4 nm; and
the first mask comprises a SiN hard mask.

13. The method as claimed in claim 10, wherein:
the second mask comprises an FH mask configured to protect the cut fin, and has a width ranging from 50 to 80 nm; and
the second mask is configured for removing the poly fences.

14. The method as claimed in claim 10, further comprising steps of:
controlling the second mask to align with the cut fin by performing an overlay control process, wherein there are openings between the lateral sides and the DTs; and expanding the openings so that the openings are big enough for removing fence residues in the DTs.

15. The method as claimed in claim 14, wherein: the openings are tunable and scalable by a thickness of the second liner, and the step of removing the poly fences is performed by a reactive ion etching (RIE) process.

16. The method as claimed in claim 10, wherein: the poly fences are effectively removed through provision of the spacers.

17. A method to form a fin structure on deep trenches (DTs) for a semiconductor device, comprising steps of:
   providing a buried oxide layer (BOX) having the DTs, and silicon polies in the DTs;
   providing a fin on the BOX and the silicon polies, wherein the silicon polies have poly fences adjacent to the fin;
   disposing a first mask on the fin;
   disposing a liner on the BOX and the first mask, wherein the liner has a first part above the fin, a second part at lateral sides of the fin and a third part on the DTs and the BOX;
   disposing a second mask on the first part of the liner and the second part of the liner;
   removing the second mask, the third part of the liner to reveal the first part of the liner and the second part of the liner; and
   removing the poly fences and forming spacers at the lateral sides of the fin.

18. The method as claimed in claim 17, further comprising a step of: removing the third part of the liner through a wet etching process.

19. The method as claimed in claim 17, further comprising steps of:
   aligning the second mask with the fin by performing an overlay control process, wherein there are openings between the lateral sides and the DTs; and
   expanding the openings so that the openings are big enough for removing fence residues in the DTs.

20. The method as claimed in claim 17, further comprising a step of:
   removing the poly fences by a reactive ion etching (RIE) process; and
   cutting the fin between DTs to form a cut fin.

* * * * *